(12) United States Patent
Ko et al.

(10) Patent No.: US 9,748,933 B2
(45) Date of Patent: Aug. 29, 2017

(54) MULTI-STEP SLEW RATE CONTROL CIRCUITS

(71) Applicant: Taiwan Semiconductor Manufacturing Company Limited, Hsinchu (TW)

(72) Inventors: Chen-Ting Ko, Hsinchu (TW); Chih-Hsien Chang, New Taipei (TW); Ruey-Bin Sheen, Taichung (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/979,892

(22) Filed: Dec. 28, 2015

(65) Prior Publication Data

US 2017/0187356 A1 Jun. 29, 2017

(51) Int. Cl.
*H03K 3/012* (2006.01)
*H03K 19/0185* (2006.01)

(52) U.S. Cl.
CPC ..... *H03K 3/012* (2013.01); *H03K 19/018507* (2013.01)

(58) Field of Classification Search
CPC .......... H03K 5/12; H03K 5/003; H03K 5/131; H03K 5/04; H03K 5/05; H03K 5/06; H03K 7/08
USPC ................ 327/170, 171, 172, 173, 174, 175
See application file for complete search history.

(56) References Cited

U.S. PATENT DOCUMENTS

| 8,324,947 | B2 * | 12/2012 | Ichikawa | G11C 29/02 |
| | | | | 326/30 |
| 2012/0032748 | A1 * | 2/2012 | Li | H03K 5/1252 |
| | | | | 332/109 |
| 2013/0229166 | A1 * | 9/2013 | Tetelbaum | H03K 4/94 |
| | | | | 323/312 |

* cited by examiner

*Primary Examiner* — John Poos
(74) *Attorney, Agent, or Firm* — Jones Day

(57) ABSTRACT

An example circuit includes: a slew rate driver configured to provide an output voltage; a first voltage provider configured to provide a first input voltage to the slew rate driver in response to the output voltage being within a first range; and a second voltage provider configured to provide a second input voltage to the slew rate driver in response to the output voltage being within a second range. The slew rate driver is further configured to change the output voltage based at least in part on the first input voltage or the second input voltage.

20 Claims, 6 Drawing Sheets

MULTI-STEP SLEW RATE CONTROL CIRCUITS

BACKGROUND

The technology described in this disclosure relates generally to electronic circuitry and more particularly to circuitry design.

Semiconductor devices continue to shrink down with the development of fabrication technology, but drive voltages of the semiconductor devices often decrease with the sizes of the devices, which may result in certain challenges in circuitry design. For example, a transmitter often has a fixed voltage swing (e.g., 3.3 V for USB 1.1). A semiconductor device may not sustain such a voltage swing, and an over-drive circuit may need to be designed. Usually, a feedback capacitor of a metal-oxide-semiconductor (MOS) structure is used for slew rate control in a transmitter.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
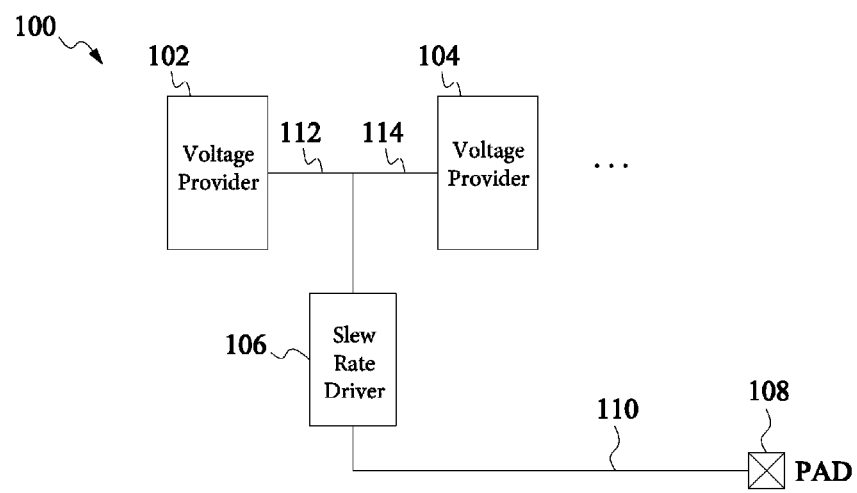
FIG. 1 depicts an example diagram showing certain components of a slew rate controller and driver circuit, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "in," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In over-drive circuitry design, MOS capacitors may be implemented for slew rate control. However, the MOS capacitors may be damaged under large voltage swings. Capacitors with a metal-oxide-metal (MOM) structure may be implemented to replace the MOS capacitors for over-drive circuitry design. But MOM capacitors often occupy large areas, which negatively affects area efficiency of the circuitry design.

FIG. 1 depicts an example diagram showing certain components of a slew rate controller and driver circuit, in accordance with some embodiments. As shown in FIG. 1, a plurality of voltage providers (e.g., including voltage providers 102 and 104) provide one or more input voltages to a slew rate driver 106 which changes an output voltage 110 based at least in part on the input voltages.

Specifically, the slew rate driver 106 provides the output voltage 110 to an output node 108 (e.g., PAD) which corresponds to a terminal or a pin. For example, external devices/circuits may sense and process the output voltage 110 through the output node 108 (e.g., PAD). Depending on the output voltage 110, one of the plurality of voltage providers provides a particular input voltage to the slew rate driver 106 which changes the output voltage 110 according to the particular input voltage.

For example, when the output voltage 110 is within a first range, the voltage provider 102 provides a voltage 112 to the slew rate driver 106 which increases the output voltage 110 to be approximately equal (e.g., in magnitude) to the voltage 112. Once the output voltage 110 becomes approximately equal to the voltage 112, the voltage provider 104 provides another voltage 114 which is higher than the voltage 112 to the slew rate driver 106 which continues to increase the output voltage 110 to be approximately equal (e.g., in magnitude) to the voltage 114.

For simplicity and for illustration purpose, the circuit 100 only shows two voltage providers 102 and 104. In some embodiments, the circuit 100 includes additional voltage providers other than the voltage providers 102 and 104, and such additional voltage providers may provide different input voltages to the slew rate driver 106 to gradually increase the output voltage 110 to a desirable level.

Figure 2:
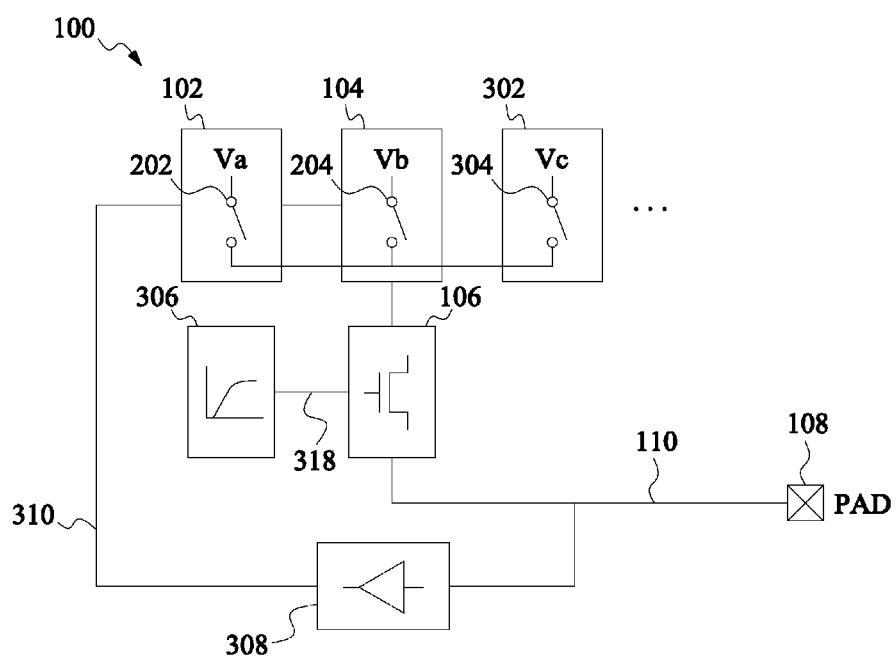
FIG. 2 depicts another example diagram showing certain components of a slew rate controller and driver circuit, in accordance with some embodiments.

FIG. 2 depicts another example diagram showing certain components of the circuit 100, in accordance with some embodiments. With respect to the embodiment of FIG. 1, like elements in the embodiment of FIG. 2 are designated with the same reference numbers for ease of understanding. As shown in FIG. 2, the circuit 100 further includes one or more voltage providers (e.g., the voltage provider 302) other than the voltage providers 102 and 104. A slew rate controller 306 provides a control signal 318 to the slew rate driver 106 to affect a rate of change of the output voltage 110. A voltage sensor 308 detects the output voltage 110 and provides a sensing signal 310 to the plurality of voltage providers (e.g., the voltage providers 102, 104, and 302). One of the voltage providers is selected to provide an input voltage to the slew rate driver 106 based at least in part on the detected output voltage.

Figure 7:
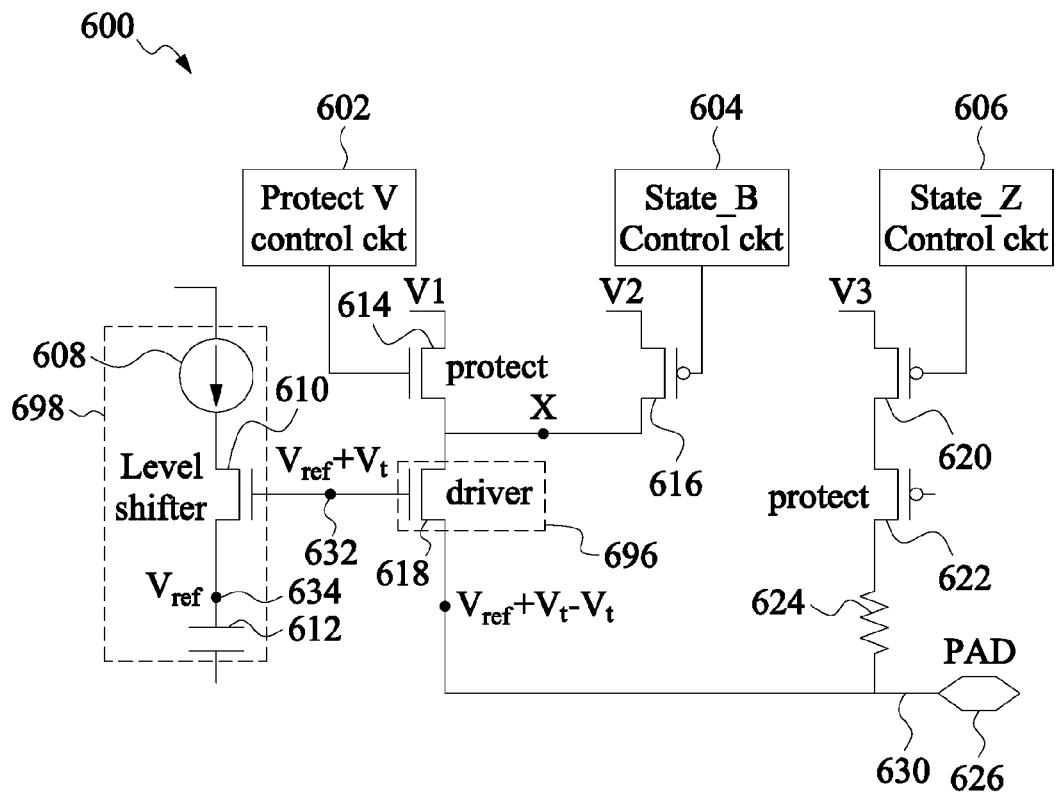
FIG. 7 depicts an example diagram showing certain components of a slew rate controller and driver circuit, in accordance with some embodiments.

In some embodiments, the slew rate driver 106 includes a n-type transistor (e.g., as shown by the slew rate driver 696 in FIG. 7). For example, a source terminal of the n-type transistor is coupled to the output node 108, and a drain terminal of the n-type transistor is coupled to the voltage providers 102 and 104. In certain embodiments, the slew rate driver 106 may include other circuit components and/or implement other circuit designs to change the output voltage 110 in response to the input voltage from one of the voltage providers. In certain embodiments, the slew rate controller 306 includes one or more transistors, one or more capacitors, and/or one or more current sources (e.g., as shown by the level shifter 698 in FIG. 7).

As shown in FIG. 2, one of the voltage providers 102, 104, and 302 can be selected to pass a respective input voltage (e.g., Va, Vb, or Vc) to the slew rate driver 106. In specific embodiments, the voltages Va, Vb and Vc satisfy: Va≤Vb≤Vc. The voltage sensor 308 detects the output voltage 110 that is smaller than a first threshold, and the voltage provider 102 is selected to provide the voltage Va to the slew rate driver 106. The output voltage 110 increases to become approximately equal (e.g., in magnitude) to the voltage Va as the n-type transistor in the slew rate driver 106 is turned on in response to the control signal 318. Then, the voltage sensor 308 detects the output voltage 110 to be larger than the first threshold but smaller than a second threshold. The voltage provider 104 is selected to provide the voltage Vb to the slew rate driver 106. The output voltage 110 continues to increase to become approximately equal (e.g., in magnitude) to the voltage Vb as the n-type transistor in the slew rate driver 106 is turned on in response to the control signal 318. Thereafter, the voltage provider 302 is selected to provide the voltage Vc to the slew rate driver 106 to further increase the output voltage 110 (e.g., to be approximately equal to Vc). The process may keep going until the output voltage 110 reaches a desired level (e.g., 3.3 V).

As the output voltage 110 increases gradually based on input voltages provided by different voltage providers, the source-drain voltage difference of the n-type transistor in the slew rate driver 106 is maintained at a proper magnitude (e.g., much smaller than 3.3 V) during the entire process. Thus, the slew rate driver 106 is not subject to excessive stress, and a large area MOM capacitor for slew rate control is not needed so that area efficiency of the circuitry design can be improved.

Figure 3:
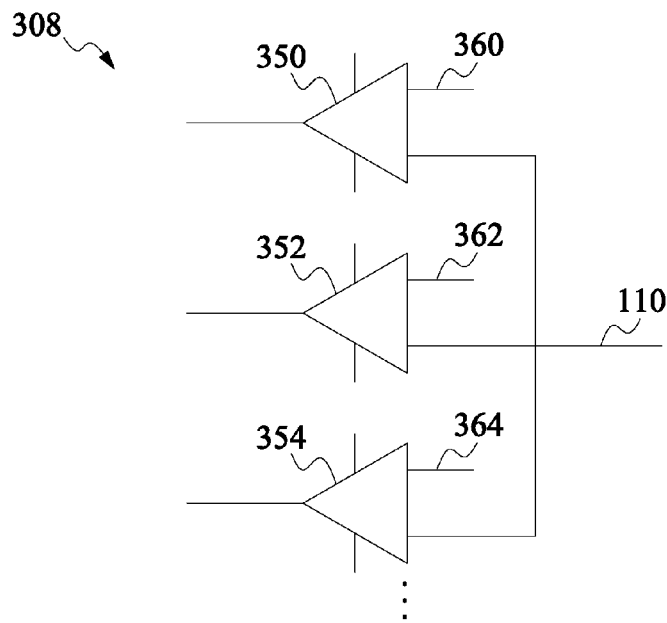
FIG. 3 depicts an example diagram showing a voltage sensor, in accordance with some embodiments.

In certain embodiments, the voltage sensor 308 includes a number of comparators that are implemented to determine whether the output voltage 110 is within a certain range so that a corresponding voltage provider (e.g., the voltage provider 102, 104 or 302) can be selected accordingly to affect the output voltage 110. For example, as shown in FIG. 3, the comparators 350, 352, and 354 compare the output voltage 110 with different reference voltages 360, 362 and 364 respectively. The outputs of the comparators 350, 352, and 354 are determined based on the comparison. In specific embodiments, a multiplexer (not shown) may be implemented to process the outputs of the comparators 350, 352 and 354 so that a particular voltage provider can be selected to provide a corresponding voltage to the slew rate driver 106. In certain embodiments, the voltage sensor 308 may include other circuit components and/or implement other circuit designs to detect the output voltage 110 for selecting a particular voltage provider.

In some embodiments, the voltage provider 102 includes a switch 202 (e.g., corresponding to one or more transistors) which passes the voltage Va to the slew rate driver 106 when the output voltage 110 is within a first range. The voltage provider 104 includes another switch 204 (e.g., corresponding to one or more transistors) which passes the voltage Vb to the slew rate driver 106 when the output voltage 110 is within a second range. The voltage provider 302 includes a switch 304 (e.g., corresponding to one or more transistors) which passes the voltage Vc to the slew rate driver 106 when the output voltage 110 is within a third range. In specific embodiments, the voltage providers may include other circuit components and/or implement other circuit designs to provide input voltages to the slew rate driver 106.

Figure 4:
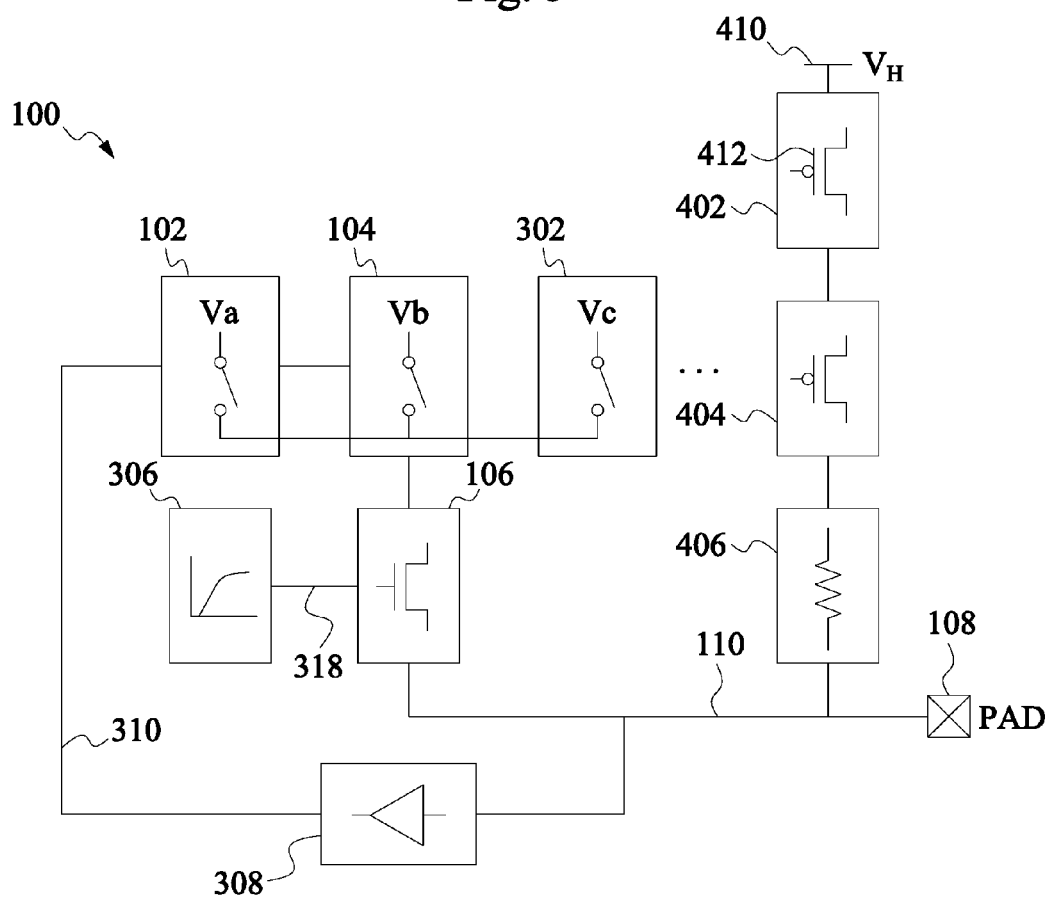
FIG. 4 depicts another example diagram showing certain components of a slew rate controller and driver circuit, in accordance with some embodiments.

FIG. 4 depicts yet another example diagram showing certain components of the circuit 100, in accordance with some embodiments. With respect to the embodiment of FIG. 3, like elements in the embodiment of FIG. 4 are designated with the same reference numbers for ease of understanding. The embodiment of FIG. 4 is similar to the embodiment of FIG. 3 except for a voltage provider 402, transistors 404 and resistors 406. As shown in FIG. 4, the circuit 100 further includes the voltage provider 402 which changes the output voltage 110 based at least in part on a power supply voltage 410 (e.g., $V_H$) in response to the output voltage 110 being within a certain range.

Specifically, as the slew rate driver 106 gradually increases the output voltage 110 to a particular level close to the power supply voltage 410, the voltage provider 402 (e.g., including a switch 412) passes the power supply voltage 410 to further increase the output voltage 110. In some embodiments, one or more transistors 404 and one or more resistors 406 are coupled to the voltage provider 402 for voltage protection. For example, the power supply voltage 410 (e.g., $V_H$) has a large magnitude (e.g., 5 V). Without the transistors 404 and the resistors 406 to sustain part of the voltage drop, the voltage provider 402, when the power supply voltage 410 is applied to influence the output voltage 110, may be subject to excessive stress.

Figure 5:
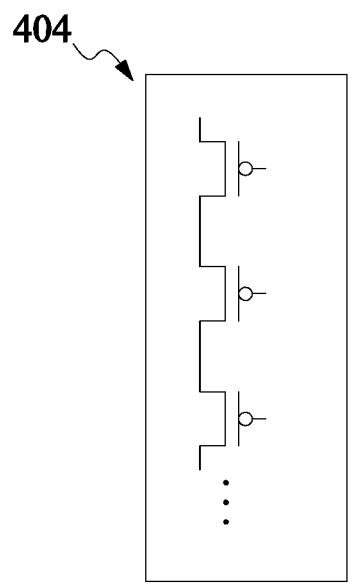
FIG. 5 depicts an example diagram showing a configuration of one or more transistors, in accordance with some embodiments.

FIG. 5 depicts an example diagram showing a configuration of the one or more transistors 404, in accordance with some embodiments. As shown in FIG. 5, a number of p-type transistors (e.g., p-MOS transistors) are connected together through source/drain terminals. Each p-type transistor corresponds to one of the voltage providers other than the voltage provider 402. Specifically, only one p-type transistor is turned on when a corresponding voltage provider is selected, while all other p-type transistors are turned off. Only when the voltage provider 402 is selected, the transistors 404 are all turned on, and thus the voltage provider 402 can influence the output voltage 110.

Figure 6:
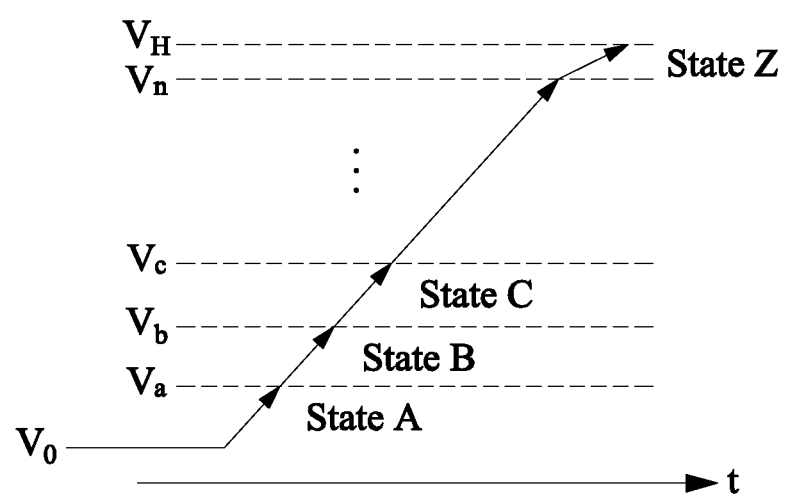
FIG. 6 depicts an example timing diagram of an output voltage of the slew rate controller and driver circuit as shown in FIG. 4, in accordance with some embodiments.

FIG. 6 depicts an example timing diagram of the output voltage 110, in accordance with some embodiments. As shown in FIG. 6, the output voltage 110 gradually increases (e.g., through various stages) from a low magnitude (e.g., $V_O$) to the power supply voltage 410 (e.g., $V_H$).

Referring to FIG. 4 and FIG. 6, initially, the output voltage 110 has a magnitude $V_O$. According to the sensing signal 310 associated with the output voltage 110, the voltage provider 102 is selected and provides the voltage Va to the slew rate driver 106 which increases the output voltage 110 to be approximately equal to the voltage Va.

Once the output voltage 110 becomes approximately equal to the voltage Va, the voltage provider 104 is selected according to the sensing signal 310 associated with the output voltage 110 and provides the voltage Vb to the slew rate driver 106 which increases the output voltage 110 to be approximately equal to the voltage Vb.

When the output voltage 110 is driven to become approximately equal to the voltage Vb, the voltage provider 302 is selected according to the sensing signal 310 and provides the voltage Vc to the slew rate driver 106 which increases the output voltage 110 to be approximately equal to the voltage Vc. More voltage providers may be properly constructed to continue increasing the output voltage 110, where devices (e.g., transistors) in these voltage providers and the slew rate driver 106 are not subject to excessive stress caused by high voltage swings.

The output voltage 110 may not be increased without any limit. Particularly, the power supply voltage 410 may be used to set an upper limit for the output voltage 410. When the output voltage 110 is gradually driven to become approximately equal to a voltage Vn (e.g., corresponding to another voltage provider different than the voltage providers 102, 104 and 302), the voltage provider 410 is selected according to the sensing signal 310 and provides the supply voltage $V_H$ to increase the output voltage 110. For example, Vn is smaller than and close to the power supply voltage 410. In some embodiments, the rate of change from Vn to $V_H$ is controlled by the slew rate controller 306. In certain embodiments, the rate of change from Vn to $V_H$ is controlled by circuit components other than the slew rate controller 306.

Figure 8:
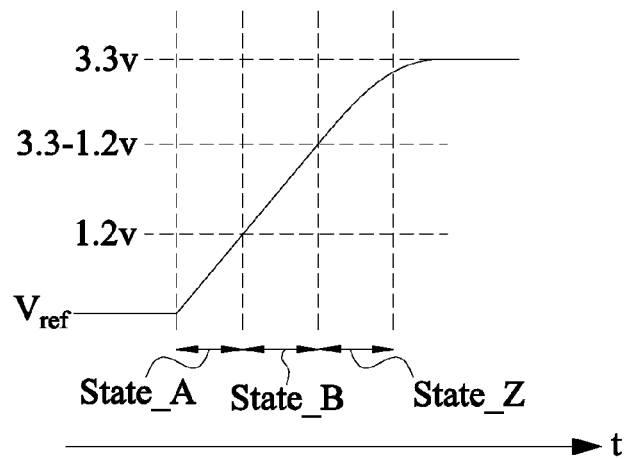
FIG. 8 depicts an example timing diagram of an output voltage of the slew rate controller and driver circuit as shown in FIG. 7, in accordance with some embodiments.

FIG. 7 depicts an example diagram showing certain components of a slew rate controller and driver circuit, in accordance with some embodiments. The slew rate controller and driver circuit 600 corresponds to one embodiment of the slew rate controller and driver circuit 100. As shown in FIG. 7, different control circuits 602, 604 and 606 are implemented to gradually increase an output voltage 630. FIG. 8 depicts an example timing diagram of the output voltage 630, in accordance with some embodiments. A slew rate driver 696 includes a transistor 618. In some embodiments, the slew rate driver 696 is the same as the slew rate driver 106.

Referring to FIG. 7 and FIG. 8, when the circuit 600 enters in a state A, the control circuit 602 turns on a transistor 614 to pass a voltage V1 (e.g., 1.2 V). A level shifter 698 including a current source 608, a transistor 610 and a capacitor 612 is implemented to provide a voltage 632 to turn on the transistor 618. In some embodiments, the level shifter 698 here performs similar functions and has similar circuit design as the slew rate controller 306.

Particularly, the current source 608 provides a current to charge the capacitor 612 through the transistor 610. A source terminal of the transistor 610 is coupled to the capacitor 612 at a node 634 which is associated with a reference voltage $V_{ref}$. The voltage 632 is approximately equal to a sum of the reference voltage $V_{ref}$ and a turn-on voltage $V_t$ of the transistor 610. The output voltage 630 corresponds to a source voltage of the transistor 618 which is coupled to an output node 626 (e.g., PAD). The output voltage 630 is thus approximately equal to the voltage 632 minus a turn-on voltage of the transistor 618. If the transistors 618 and 610 have similar turn-on voltages, the output voltage 630 is approximately equal to the reference voltage $V_{ref}$. In the state A, the reference voltage $V_{ref}$ increases when the capacitor 612 is charged, and in response the output voltage 630 increases to be approximately equal to the voltage V1.

Once the output voltage 630 becomes approximately equal to the voltage V1, the circuit 600 enters in a state B (e.g., as shown in FIG. 8), and the control circuit 604 turns on a transistor 616 to pass a voltage V2 (e.g., 2.1 V). The output voltage increases to be approximately equal to the voltage V2. In some embodiments, the control circuit 602 operates to turn off the transistor 614 in the state B.

When the output voltage 630 becomes approximately equal to the voltage V2, the circuit 600 enters a state Z (e.g., as shown in FIG. 8). The control circuit 606 turns on the transistor 620 to pass a voltage V3 (e.g., 3.3 V). The output voltage 630 increases until it is approximately equal to the voltage V3.

Figure 9:
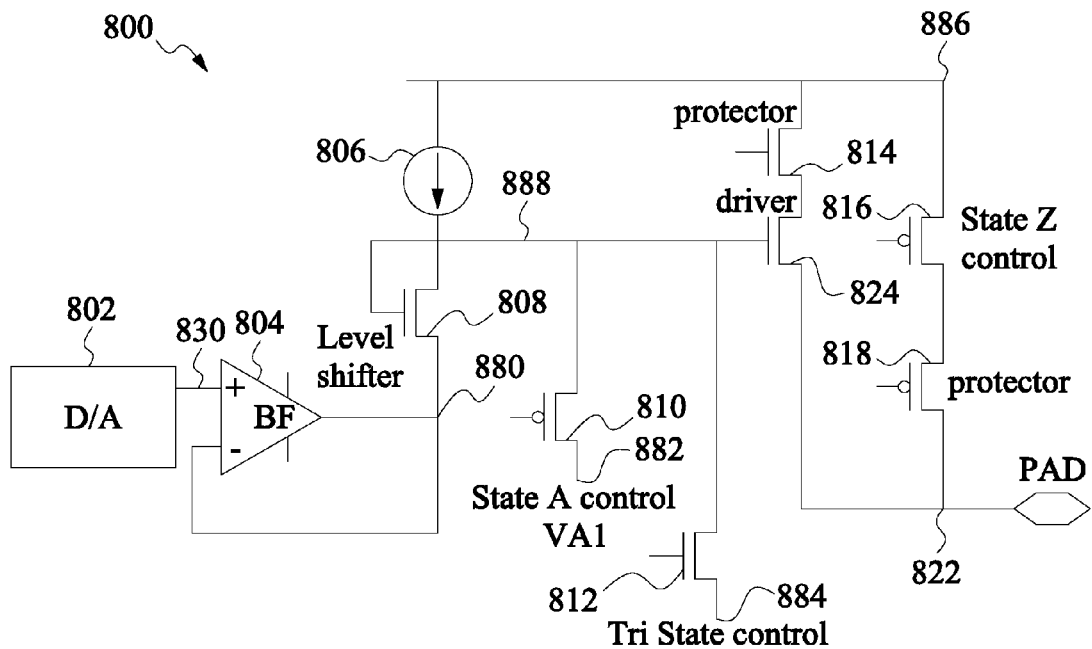
FIG. 9 depicts an example diagram showing certain components of a slew rate controller and driver circuit, in accordance with some embodiments.
Figure 10:
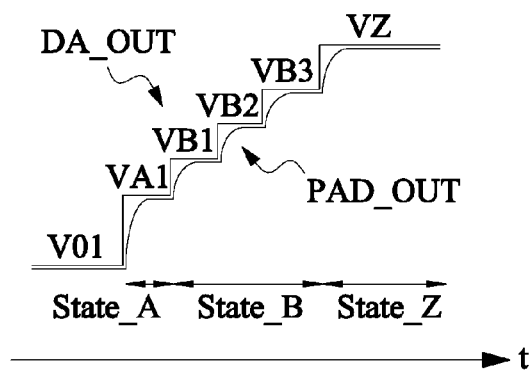
FIG. 10 depicts an example timing diagram of an output voltage of the slew rate controller and driver circuit as shown in FIG. 9, in accordance with some embodiments.

FIG. 9 depicts another example diagram showing certain components of a slew rate controller and driver circuit, in accordance with some embodiments. As shown in FIG. 9, the slew rate controller and driver circuit 800 is implemented to incrementally increase an output voltage 822. A digital-to-analog converter (DAC) 802 is implemented to form precise levels for the output voltage 822 to follow. Transistors 810, 812 and 816 function as voltage providers. FIG. 10 depicts an example timing diagram of the output voltage 822, in accordance with some embodiments. The functionalities of transistors 814, 824, 816 and 818 are described in detail below.

The DAC 802 provides an analog signal 830 to a buffer 804 (e.g., including an operational amplifier) which keeps a source voltage 880 of a transistor 808 approximately equal to the analog signal 830. A voltage 888 at the gate terminal of the transistor 824 is approximately equal to the voltage 880 plus a turn-on voltage of the transistor 808. The output voltage 822 is approximately equal to the voltage 888 minus a turn-on voltage of the transistor 824.

Referring to FIG. 9 and FIG. 10, in an initial time period, the DAC 802 sets the analog signal 830 to a starting voltage V01. The buffer 804 changes the source voltage 880 of the transistor 808 to be approximately equal to V01. In response, the voltage 888 at the gate terminal of the transistor 824 is approximately equal to the voltage 880 plus the turn-on voltage of the transistor 808. The output voltage 822 is approximately equal to the voltage 888 minus the turn-on voltage of the transistor 824. Thus, if the turn-on voltages of the transistors 808 and 824 are comparable, the output voltage 822 is approximately equal to V01. During the initial time period, the transistors 810, 816 and 818 are turned off. The transistor 814 is turned on so that the transistor 824 can operate and the source-drain voltage drop of the transistor 824 may not become too large.

After the initial time period, the DAC 802 increases the analog signal 830 by a predetermined amount so that the analog signal 830 increases from V01 to VA1, and the circuit 800 enters in a state A. The buffer 804 changes the source voltage 880 of the transistor 808 to be approximately equal to VA1. As the voltage 888 is pretty small at this time, the transistor 810 which is used for state A control is turned on to quickly pull up the voltage 888. Specifically, a source voltage 882 of the transistor 810 is set to be approximately equal to VA1 plus the turn-on voltage of the transistor 824. Thus, the voltage 888 is quickly pulled up (e.g., quickly increasing by 10%) in response to the transistor 810 being turned on. In turn the output voltage 822 is quickly changed to VA1. During a predetermined time period for the state A, the transistors 816 and 818 are turned off.

After the predetermined time period for the state A, the DAC 802 increases the analog signal 830 by a predetermined amount so that the analog signal 830 increases from VA1 to VB1, and the circuit 800 enters in a state B. The transistor 810 is turned off. The buffer 804 changes the source voltage 880 of the transistor 808 to be approximately equal to VB1. In response, the voltage 888 increases and in turn the output voltage 822 changes from VA1 to VB1.

Similarly, when the DAC 802 increases the analog signal 830 from VB1 to VB2, the output voltage 822 changes from VB1 to VB2. When the DAC 802 increases the analog signal 830 from VB2 to VB3, the output voltage 822 changes from VB2 to VB3. During a predetermined time period for the state B, the transistors 810, 816 and 818 are turned off.

After the predetermined time period for the state B, the DAC 802 further increases the analog signal 830 from VB3 to VZ which corresponds to the supply voltage 886, and the circuit 800 enters in a state Z. Then, the transistor 816 is turned on to change the output voltage 822 from VB3 to VZ (i.e., the supply voltage 886). The transistor 818 is also turned on so that the transistor 816 can operate and the source-drain voltage drop of the transistor 816 may not become too large. The transistor 814 is turned off. As the difference between VB3 and VZ can be large, the transistor 812 is turned on to set the voltage 888 at the gate terminal of the transistor 824 to a fixed voltage (e.g., VZ/2) to prevent the transistor 824 from being subject to an excessive gate-source voltage.

In specific embodiments, the transistor 814 performs similar functions as the voltage provider 102 as shown in FIG. 1, and the transistor 824 performs similar functions as the slew rate driver 106. In certain embodiments, the transistor 816 performs similar functions as the transistor 620 as shown in FIG. 8, and the transistor 818 performs similar functions as the transistor 622.

Figure 11:
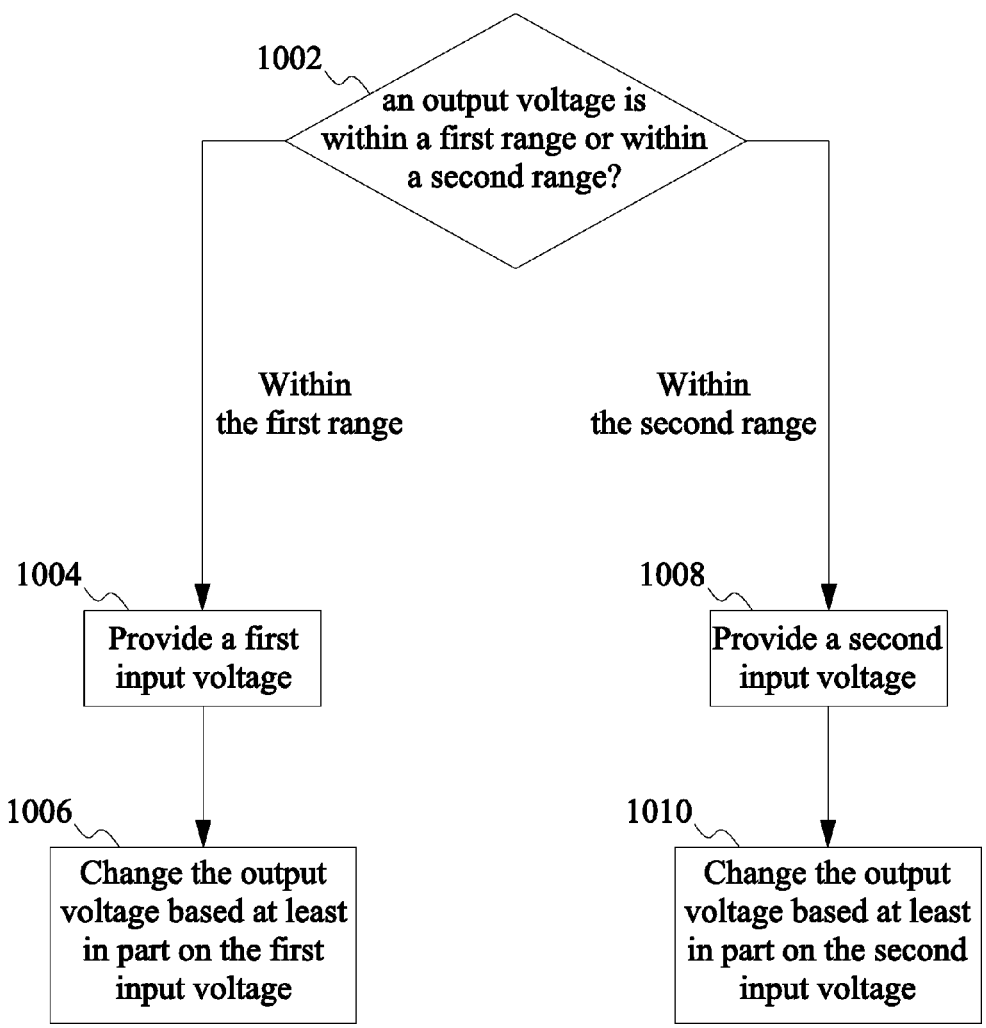
FIG. 11 depicts an example flow diagram for slew rate control, in accordance with some embodiments.

FIG. 11 depicts an example flow diagram for slew rate control, in accordance with some embodiments. At 1002, whether an output voltage of a driver is within a first range or within a second range. If the output voltage is within a first range, a first input voltage is provided, at 1004; and the output voltage is changed based at least in part on the first input voltage, at 1006. If the output voltage is within a second range, a second input voltage is provided, at 1008; and the output voltage is changed based at least in part on the second input voltage, at 1010.

According to one embodiment, a circuit comprises: a slew rate driver configured to provide an output voltage; a first voltage provider configured to provide a first input voltage to the slew rate driver in response to the output voltage being within a first range; and a second voltage provider configured to provide a second input voltage to the slew rate driver in response to the output voltage being within a second range. The slew rate driver is further configured to change the output voltage based at least in part on the first input voltage or the second input voltage.

According to another embodiment, a circuit comprises: a slew rate driver configured to provide an output voltage; a slew rate controller configured to provide a control signal to the slew rate driver to affect the output voltage; a first transistor network configured to provide a first input voltage to the slew rate driver in response to the output voltage being within a first range; and a second transistor network configured to provide a second input voltage to the slew rate driver in response to the output voltage being within a second range. The slew rate driver is further configured to change the output voltage based at least in part on the first input voltage or the second input voltage.

According to yet another embodiment, a circuit comprises: a slew rate driver configured to provide an output voltage; a slew rate controller configured to provide a control signal to the slew rate driver to affect the output voltage; a voltage sensor configured to detect the output voltage; a first transistor network configured to provide a first input voltage to the slew rate driver in response to the detected output voltage being within a first range; and a second transistor network configured to provide a second input voltage to the slew rate driver in response to the detected output voltage being within a second range. The slew rate driver is further configured to change the output voltage based at least in part on the first input voltage or the second input voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
   a slew rate driver configured to provide an output voltage;
   a first voltage provider configured to provide a first input voltage via a first switch to the slew rate driver in response to the output voltage being within a first range; and
   a second voltage provider configured to provide a second input voltage via a second switch to the slew rate driver in response to the output voltage being within a second range;
   wherein the slew rate driver includes a transistor directly coupled to the first voltage provider via the first switch and the second voltage provider via the second switch and is further configured to change the output voltage based at least in part on the first input voltage or the second input voltage.

2. The circuit of claim 1, further comprising:
   a third voltage provider configured to provide a third input voltage to the slew rate driver in response to the output voltage being within a third range;
   wherein the slew rate driver is further configured to change the output voltage based at least in part on the third input voltage.

3. The circuit of claim 2, wherein the third voltage provider includes a switch configured to pass the third input voltage to the slew rate driver in response to the output voltage being within the third range.

4. The circuit of claim 2, wherein the slew rate driver is further configured to increase the output voltage to be approximately equal to the third input voltage in response to the third voltage provider providing the third input voltage to the slew rate driver.

5. The circuit of claim 1, wherein the slew rate driver is further configured to increase the output voltage to be approximately equal to the first input voltage in response to the first voltage provider providing the first input voltage to the slew rate driver.

6. The circuit of claim 1, wherein the slew rate driver is further configured to increase the output voltage to be approximately equal to the second input voltage in response to the second voltage provider providing the second input voltage to the slew rate driver.

7. The circuit of claim 1, wherein:
the first voltage provider includes the first switch configured to pass the first input voltage to the slew rate driver in response to the output voltage being within the first range; and
the second voltage provider includes the second switch configured to pass the second input voltage to the slew rate driver in response to the output voltage being within the second range.

8. The circuit of claim 1, further comprising:
a voltage sensor configured to detect the output voltage and determine whether the output voltage is within the first range or within the second range.

9. The circuit of claim 1, further comprising:
a slew rate controller configured to provide a control signal to the slew rate driver to affect a rate of change of the output voltage.

10. The circuit of claim 1, wherein the slew rate driver includes a n-type transistor coupled to the first voltage provider and the second voltage provider.

11. The circuit of claim 1, further comprising:
a fourth voltage provider configured to change the output voltage based at least in part on a power supply voltage in response to the output voltage being within a fourth range.

12. The circuit of claim 11, wherein the fourth voltage provider includes a switch configured to pass the power supply voltage to increase the output voltage.

13. The circuit of claim 1, wherein:
the first range corresponds to one or more first voltages; and
the second range corresponds to one or more second voltages larger than the one or more first voltages.

14. A circuit comprising:
a slew rate driver configured to provide an output voltage;
a slew rate controller configured to provide a control signal to the slew rate driver to affect the output voltage;
a first transistor network configured to provide a first input voltage via a first switch to the slew rate driver in response to the output voltage being within a first range; and
a second transistor network configured to provide a second input voltage via a second switch to the slew rate driver in response to the output voltage being within a second range;
wherein the slew rate driver includes a transistor directly coupled to the first voltage provider via the first switch and the second voltage provider via the second switch and is further configured to change the output voltage based at least in part on the first input voltage or the second input voltage.

15. The circuit of claim 14, further comprising:
a third transistor network configured to provide a third input voltage to the slew rate driver in response to the output voltage being within a third range;
wherein the slew rate driver is further configured to change the output voltage based at least in part on the third input voltage.

16. The circuit of claim 14, wherein the slew rate controller includes:
a level shifter circuit configured to provide a control signal to the slew rate driver to affect a rate of change of the output voltage.

17. The circuit of claim 16, wherein the slew rate controller further includes:
a digital-to-analog converter configured to provide an analog signal;
wherein the level shifter circuit is further configured to provide the control signal based on at least information associated with the analog signal.

18. The circuit of claim 14, further comprising:
a fourth transistor network configured to change the output voltage based at least in part on a power supply voltage in response to the output voltage being within a fourth range.

19. The circuit of claim 18, wherein the fourth transistor network includes one or more p-type transistors configured to be turned on in response to the output voltage being within the fourth range.

20. A circuit comprising:
a slew rate driver configured to provide an output voltage;
a voltage sensor configured to detect the output voltage;
a first voltage provider configured to provide a first input voltage via a first switch to the slew rate driver in response to the detected output voltage being within a first range; and
a second voltage provider configured to provide a second input voltage via a second switch to the slew rate driver in response to the detected output voltage being within a second range;
wherein the slew rate driver includes a transistor directly coupled to the first voltage provider via the first switch and the second voltage provider via the second switch and is further configured to change the output voltage based at least in part on the first input voltage or the second input voltage.

* * * * *